(12) United States Patent  
Otremba et al.

(10) Patent No.: US 7,759,777 B2
(45) Date of Patent: Jul. 20, 2010

(54) SEMICONDUCTOR MODULE

(75) Inventors: Ralf Otremba, Kaufbeuren (DE); Xaver Schloegel, Sachsenkam (DE); Klaus Schiess, Allensbach (DE); Charlie Tan Tien Lai, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 316 days.

(21) Appl. No.: 11/735,762

(22) Filed: Apr. 16, 2007

(65) Prior Publication Data

US 2008/0251903 A1 Oct. 16, 2008

(51) Int. Cl.
*H01L 23/495* (2006.01)

(52) U.S. Cl. .................. 257/668; 257/735; 257/E23.06

(58) Field of Classification Search .................. 257/668, 257/704, 735, 776, 784, E23.06
See application file for complete search history.

(56) References Cited

U.S. PATENT DOCUMENTS

| 5,886,399 | A | * | 3/1999 | Ohsawa et al. ............... 257/668 |
| 5,986,459 | A | * | 11/1999 | Fukaya et al. ............... 324/755 |
| 6,133,634 | A | | 10/2000 | Joshi |
| 6,396,127 | B1 | | 5/2002 | Munoz et al. |
| 6,528,880 | B1 | | 3/2003 | Planey |
| 6,582,990 | B2 | | 6/2003 | Standing |
| 6,624,522 | B2 | | 9/2003 | Standing et al. |
| 6,677,669 | B2 | | 1/2004 | Standing |
| 6,767,820 | B2 | | 7/2004 | Standing et al. |
| 6,774,499 | B1 | | 8/2004 | Yang |
| 6,890,845 | B2 | | 5/2005 | Standing et al. |
| 2001/0048156 | A1 | | 12/2001 | Fukuizumi |
| 2004/0063240 | A1 | | 4/2004 | Madrid et al. |
| 2004/0266037 | A1 | | 12/2004 | Knapp et al. |
| 2005/0218498 | A1 | | 10/2005 | Hata et al. |
| 2006/0060891 | A1 | | 3/2006 | Pavier |
| 2006/0145319 | A1 | | 7/2006 | Sun et al. |
| 2009/0127573 | A1 | * | 5/2009 | Guenther et al. ............... 257/98 |

FOREIGN PATENT DOCUMENTS

| DE | 10308928 A1 | 9/2004 |
| DE | 102004030042 A1 | 1/2006 |
| JP | 11054673 A | 2/1999 |

OTHER PUBLICATIONS

"Embedded Wafer Level Ball Grid Array (eWLB)", M. Brunnbauer, et al., 2006 Electronics Packaging Technology Conference, IEEE (2006).

* cited by examiner

*Primary Examiner*—Hoai v Pham
(74) *Attorney, Agent, or Firm*—Dicke, Billig & Czaja, PLLC

(57) ABSTRACT

A module having a semiconductor chip with a first contact element on a first main surface and a second contact element on a second main surface is disclosed. The semiconductor chip is arranged on a carrier. An insulating layer and a wiring layer cover the second main surface and the carrier.

7 Claims, 6 Drawing Sheets

SEMICONDUCTOR MODULE

BACKGROUND

The invention relates to a semiconductor module and a method for producing a semiconductor module.

In semiconductor modules, semiconductor chips can be arranged on carriers and be connected to the carriers e.g., by die bonding or wire bonding methods.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1A:
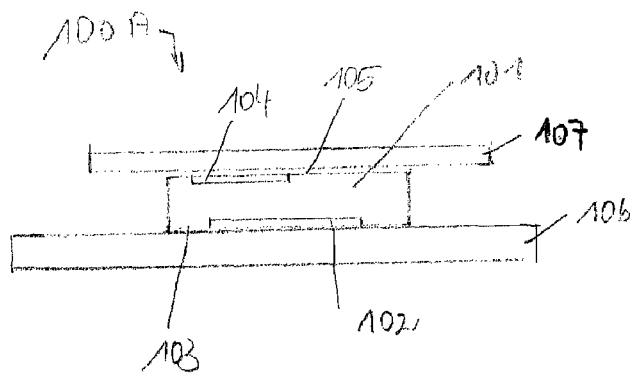
FIGS. 1A to 1C illustrate schematic illustrations of modules 100A to 100C as exemplary embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments provide a module including a semiconductor chip having a first contact element on a first main surface and a second contact element on a second main surface. The semiconductor chip is arranged on a carrier in such a way that the first main surface of the semiconductor chip faces the carrier. The module has an insulating layer and a wiring layer, which cover the second main surface and the carrier.

In another embodiment, a module includes a semiconductor chip, which is introduced in a depression of an electrically conductive carrier, and a wiring layer covering the semiconductor chip and the carrier.

In another embodiment, a module includes a semiconductor chip, which is introduced into a depression of a carrier, and a film covering the semiconductor chip and the carrier.

In another embodiment, a plurality of semiconductor chips having in each case a first contact element on a first main surface and in each case a second contact element on a second main surface are provided. The semiconductor chips are introduced into depressions of a carrier in such a way that the first main surfaces face the carrier. An insulating layer and a wiring layer are applied to the second main surface of the semiconductor chips after the introduction of the semiconductor chips into the depressions of the carrier. The semiconductor chips are then singulated.

Modules containing semiconductor chips are described below. The specific embodiment of the semiconductor chips is not important in this case. The semiconductor chips may be, for example, integrated circuits of arbitrary form, microprocessors, power MOSFETs or microelectromechanical components. The semiconductor chips do not have to be fabricated from a specific semiconductor material; they may additionally also contain non-conductive inorganic and/or organic materials. The semiconductor chips may be packaged or unpackaged.

The semiconductor chips may have contact elements that enable electrical contact to be made with the semiconductor chips. The contact elements may include an arbitrary conductive material, for example a metal such as e.g., aluminum, gold or copper, a metal alloy or a conductive organic material.

The semiconductor chips may be introduced into depressions of carriers. The depressions may be produced in various ways, for example by embossing, etching, milling or electrochemical growth. The carriers may serve, inter alia, as a heat sink for dissipating the heat generated by the semiconductor chips.

The carriers may include electrically conductive materials such as e.g., copper or iron-nickel alloys. The carriers may in each case be electrically connected to a contact element of the semiconductor chip with which the semiconductor chip is seated on the carrier. The electrical connections may be produced e.g., by reflow soldering, vacuum soldering, diffusion soldering or adhesive bonding by using a conductive adhesive.

If diffusion soldering is used as connecting technique between carrier and semiconductor chip, it is possible to use solder materials which lead to intermetallic phases after the end of the soldering operation at the interface between carrier and semiconductor chip on account of interface diffusion processes. In this case, the use of AuSn, AgSn, CuSn, AgIn, AuIn or CuIn solders is conceivable, by way of example, for copper or iron-nickel carriers.

If the carriers are adhesively bonded to the semiconductor chips, conductive adhesives may be used. The adhesives may be based e.g., on epoxy resins and be enriched with gold, silver, nickel or copper in order to produce the electrical conductivity.

The contact elements of the semiconductor chips may have a diffusion barrier. The diffusion barrier prevents solder material from diffusing from the carrier into the semiconductor chip during the diffusion soldering. A thin titanium layer on a contact element brings about such a diffusion barrier, for example.

The carrier and the semiconductor chip may be covered by a wiring layer. The wiring layer may cover the carrier entirely or else only partly. The wiring layer may be constructed from an individual layer, but it may also include a plurality of layers lying one on top of another. The individual layers may include e.g., polymer films, polymer sheets, photoresists or metals. The individual layers may be patterned, such that it is possible to produce e.g., conductor tracks in the layers, which connect the contact elements of the semiconductor chip and/or lead to predefined locations at the surface of the wiring layer. In this case, the conductor tracks may lead to external contact elements of the modules, the area of which may be larger than the area of the contact elements of the semiconductor chips. The conductor tracks and/or the external contact elements may be arranged in such a way that they extend beyond the edge of the semiconductor chip.

Furthermore, the carrier and the semiconductor chip may be covered entirely or else only partly by an insulating layer. The insulating layer may be fabricated for example from a polymer film, a polymer sheet or a photoresist.

FIG. 1A illustrates a module 100A in cross section as an exemplary embodiment. The module 100A contains a semiconductor chip 101 having a first contact element 102 on a first main surface 103 and a second contact element 104 on a second main surface 105. The semiconductor chip 101 has been applied to a carrier 106 by the main surface 103. An insulating layer and a wiring layer 107 are fitted on the main surface 105 of the semiconductor chip 101, and at least partly cover the second main surface 105 and the carrier 106.

Figure 1B:
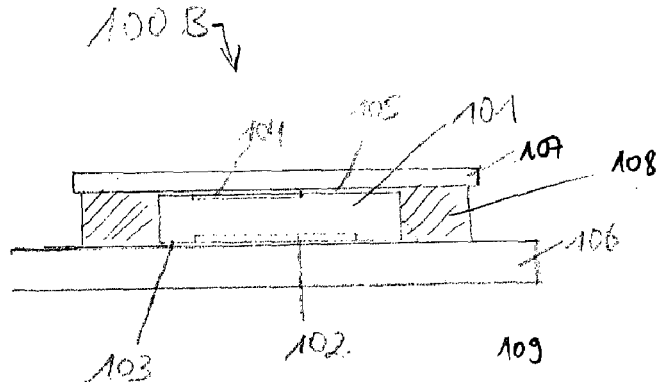
Figure 1C:
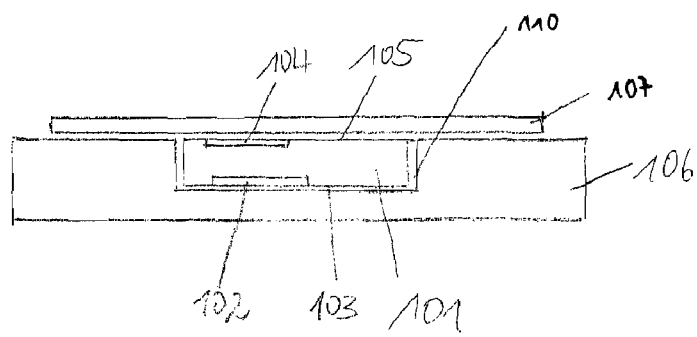

FIGS. 1B and 1C illustrate modules 100B and 100C as developments of the module 100A illustrated in FIG. 1A. In the case of the module 100B illustrated in FIG. 1B, an insulating layer 108 is arranged between the carrier 106 and the wiring layer 107, the insulating layer covering at least one lateral face 109 of the semiconductor chip 101. In the case of the module 100C illustrated in FIG. 1C, the carrier 106 has a depression 110, into which the semiconductor chip 101 is introduced.

Figure 2:
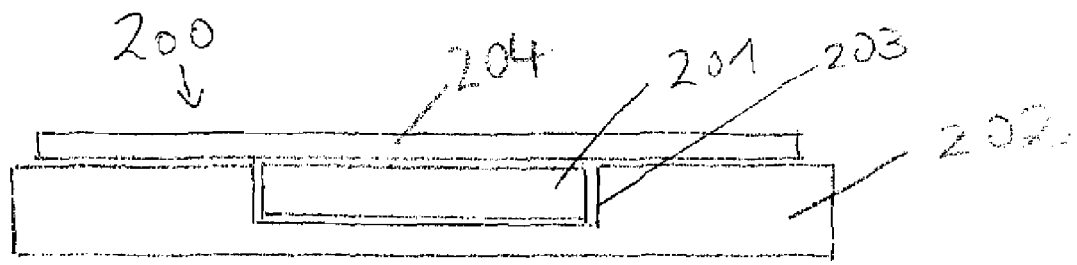
FIG. 2 illustrates a schematic illustration of a module 200 as a further exemplary embodiment.

FIG. 2 illustrates a module 200 as a further exemplary embodiment. The module 200 contains a semiconductor chip 201 and an electrically conductive carrier 202. The carrier 202 has a depression 203, into which the semiconductor chip 201 is introduced. A wiring layer 204 covers the semiconductor chip 201 and the carrier 202.

Figure 3:
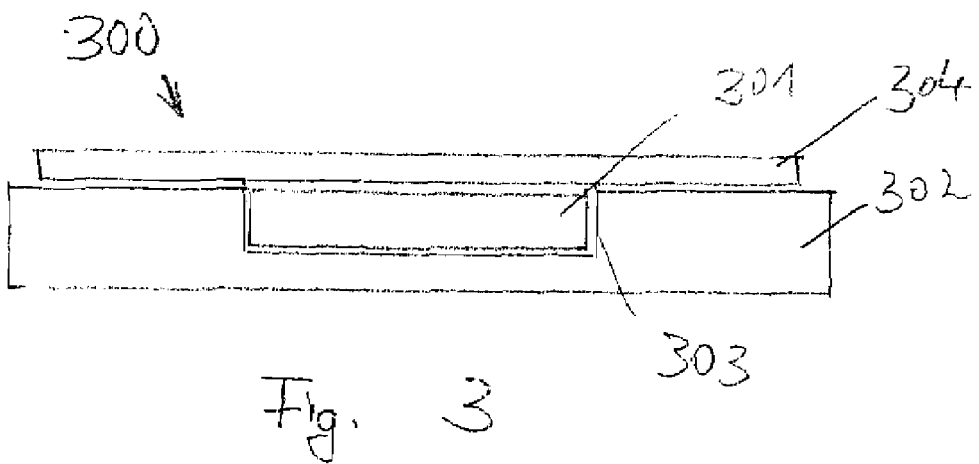
FIG. 3 illustrates a schematic illustration of a module 300 as a further exemplary embodiment.

FIG. 3 illustrates a module 300 as a further exemplary embodiment. The module 300 contains a semiconductor chip 301 situated in a depression 303 of a carrier 302. A film 304 covers the semiconductor chip 301 and the carrier 302.

Figure 4A:
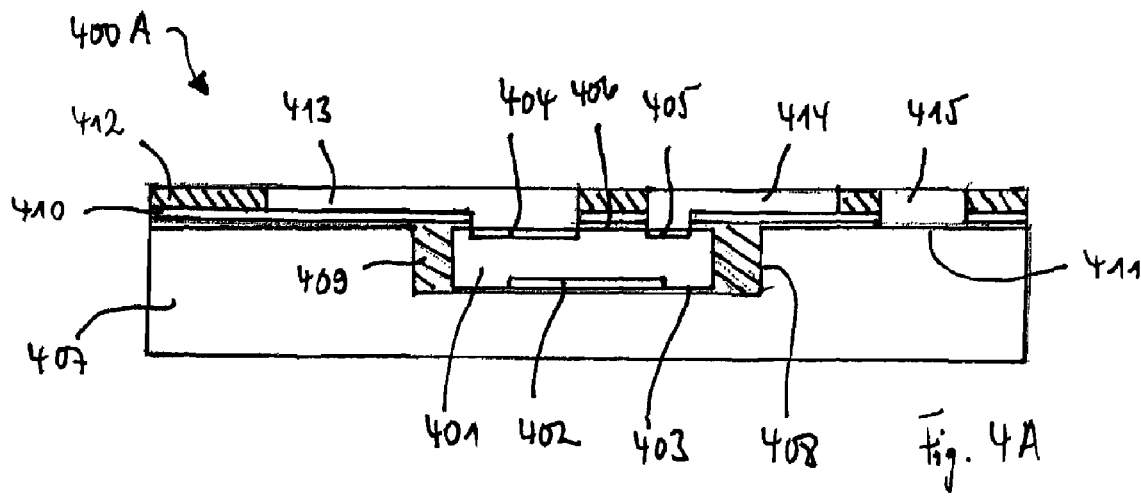
FIGS. 4A to 4C illustrate schematic illustrations of modules 400A to 400C as further exemplary embodiments.
Figure 4B:
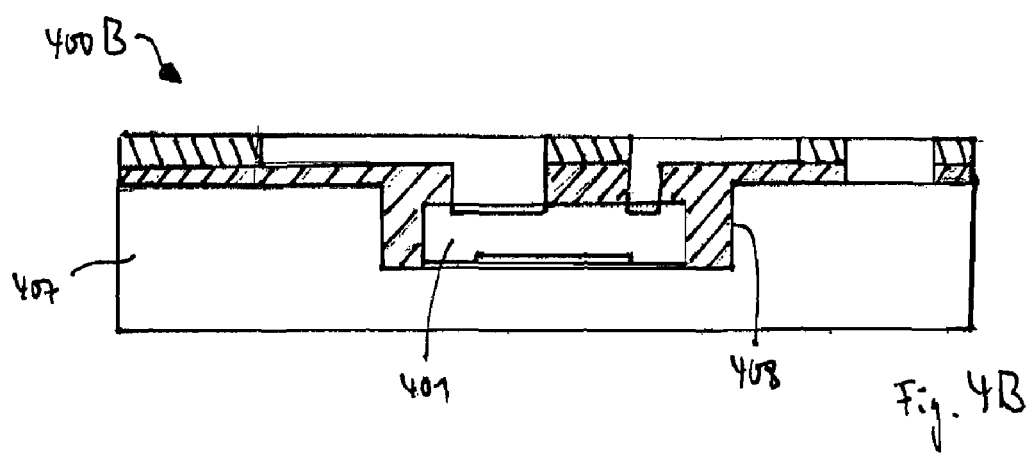
Figure 4C:
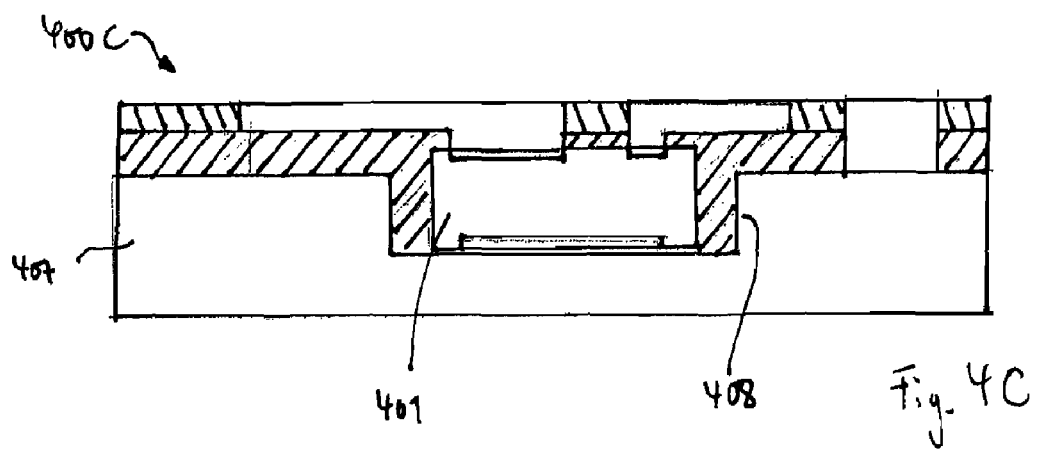

FIGS. 4A to 4C illustrate modules 400A, 400B and 400C representing developments of the modules 100A, 100C, 200 and 300 described above. The configurations of the modules 400A to 400C that are described below can therefore likewise be applied to the modules 100A, 100C, 200 and 300.

The module 400A contains a semiconductor chip 401 having a first contact element 402 on a first main surface 403 and second contact elements 404 and 405 on a second main surface 406, and also a carrier 407 having a depression 408, into which the semiconductor chip 401 is introduced.

The carrier 407 may include a metallic material, for example copper or an iron-nickel alloy. The carrier 407 and the contact element 402 are connected to one another by using an electrically conductive adhesion promoter, which is not explicitly illustrated in FIG. 4A. A solder material may be used as adhesion promoter, which solder material connects the contact element 402 to the carrier 406 according to a customary soldering method. By way of example, a diffusion soldering method may be employed, in which an intermetallic phase arises as a result of diffusion at the interface between the contact element 402 and the carrier 407. As an alternative, a conductive adhesive, e.g., an epoxy resin adhesive, may be used as the adhesion promoter.

The main surface 403 of the semiconductor chip 401 may be smaller than the base area of the depression 408, with the result that a clearance 409 remains between at least one lateral face of the semiconductor chip 401 and a lateral face of the depression 408. The clearance 409 may optionally be filled with an insulating material, for example an organic material, such as e.g., epoxy resins, polyimides or silicone gel, or remain unfilled.

Furthermore, the semiconductor chip 401 and the carrier 407 may be covered with an insulating, in particular organic film 410. This is recommended particularly if the clearance 409 is not filled with the insulating material, since the film 410 also covers the clearance 409 in this case. The film 410 may be photopatternable, such that the film 410 can be opened by exposure and development processes at the locations of the contact elements 404 and 405 and also at a location 411 above the carrier 407. If the clearance 409 is filled with the insulating material, instead of the film 410 it is also possible, by way of example, for a patternable layer composed of a soft and insulating material such as e.g., photoresist or polyimides, to be applied to the semiconductor chip 401 and the carrier 407. The film 410 or the patternable layer used as an alternative may have a thickness within the range of 1 to 100 µm. The openings introduced into the film 410 or the layer by using the patterning above the contact elements 404 and 405 and also above the location 411 are filled with a metal layer.

A further patternable layer 412 may be applied to the film 410, external contact elements 413, 414 and 415 being introduced into the layer by patterning and metallization processes. In this case, the external contact elements 413, 414 and 415 are connected, through the openings in the film 410, to the contact elements 404 and respectively 405 and respectively to the carrier 407 at the location 411. On account of the electrical connection of the carrier 407 to the contact element 402, the external contact element 415 enables electrical contact to be made with the contact element 402 from the top side of the module 400A. The thickness of the layer 412 and of the external contact elements 413 to 415 lies within the range of 5 to 100 µm.

The external contact elements 413 and/or 414 may be designed in such a way that they extend beyond the edge of the semiconductor chip 401. On account of this measure, the external contact elements 413 and/or 414 may have a contact area that is as large as desired. By way of example, the contact areas of the external contact elements 413 and/or 414 may be larger than the contact areas of the contact elements 404 and 405 respectively connected to them. Furthermore, besides being connected to the external contact element 415, the contact element 402 of the semiconductor chip 401 may be connected to a further external contact element on the top side of the module 400A. The measures described above enable electrical contact to be made with the semiconductor chip 401 from outside the module 400A with a low contact resistance. Furthermore, the module 400A can be incorporated into a circuit very flexibly in connection terms.

It is not necessary for the module 400A to be surrounded by a housing. The module 400A may be mounted onto a printed circuit board for example in the manner of a flip-chip type. In this case, soldering contacts between the external contact elements 413 to 415 and contact areas of the printed circuit board provide both for a mechanical fixing of the module 400A on the printed circuit board and for electrical contact-making.

The semiconductor chip 401 may be for example a power semiconductor and in particular a power MOSFET having a vertical structure. In this case, the contact element 402 may be the drain terminal, the contact element 404 may be the source terminal and the contact element 405 may be the gate terminal of the power MOSFET.

FIG. 4A illustrates that the semiconductor chip 401 and the depression 408 may have the same height. As is illustrated in FIGS. 4B and 4C, however, the height of the semiconductor chip 401 may also be less than or greater than the height of the depression 408. In the case of the modules 400B and 400C, not only is it possible for the clearance 409 to be filled with the insulating material, but it is also possible for the surface of the carrier 407 and of the semiconductor chip 401 to be covered therewith. This results in height equalization between the semiconductor chip 401 and the depression 407 having a different height. If the semiconductor chip 401 is a power MOSFET having a vertical structure, the height of which typically lies within the range of 50 to 350 µm, the depression 408 may have a height within the range of 5 µm to 0.5 mm.

Figure 5:
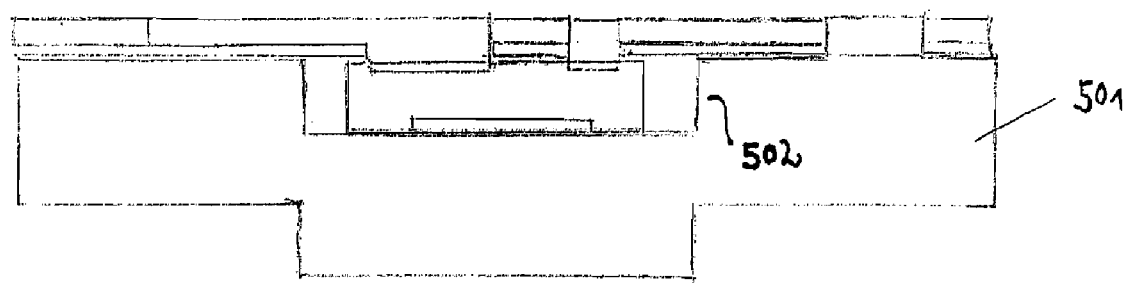
FIG. 5 illustrates a schematic illustration of a module 500 as a further exemplary embodiment.

Whereas the depression 408 has been produced by etching, milling or electrochemical growth in the case of the modules 400A to 400C, FIG. 5 illustrates a module 500 into whose carrier 501 a depression 502 has been introduced by deep-drawing or embossing. As a result, a process is produced on the underside of the carrier 501.

Figure 6:
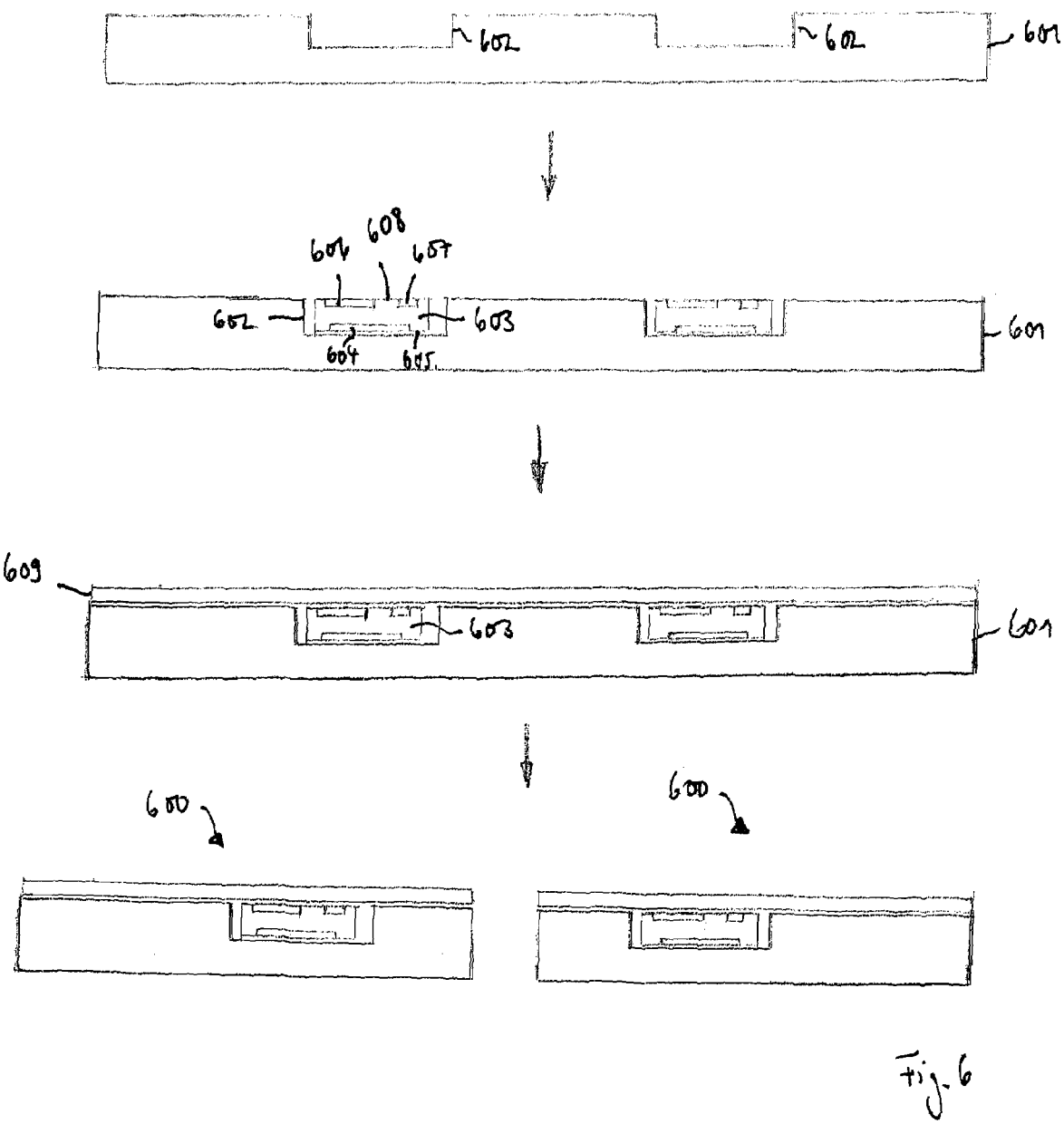
FIG. 6 illustrates a schematic illustration of a method for producing modules 600 as a further exemplary embodiment.

FIG. 6 illustrates a method for producing modules 600. The modules 600 may have the same configurations as the modules 400A to 400C illustrated in FIGS. 4A to 4C. A first method process involves providing a carrier 601. The carrier 601 has a plurality of depressions 602 that have been introduced into the carrier 601 e.g., by embossing, milling, deep-drawing or electrochemical growth. Semiconductor chips 603 having in each case a first contact element 604 on a first main surface 605 and in each case two second contact elements 606 and 607 on a second main surface 608 are inserted into the depressions 602 of the carrier 601 in such a way that precisely one semiconductor chip 603 is seated in each depression 602 and the first main surfaces 605 face the carrier 601. In a further method step, an insulating layer and a wiring layer 609 are applied to the second main surface 608 of the semiconductor chips 603 and to the carrier 601. The wiring layer 609 has a layer thickness within the range of 1 to 1000 µm, in particular within the range of 10 to 100 µm. The wiring layer 609 may be produced by using thin-film techniques. In this case, by way of example, masks are produced by of photolithographic processes and metal layers are deposited on the masks, individual conductor tracks remaining after the removal of the masks. After the application of the insulating layer and the wiring layer 609, the modules 600 are singulated. This is usually done by sawing up the carrier 601.

Figure 7:
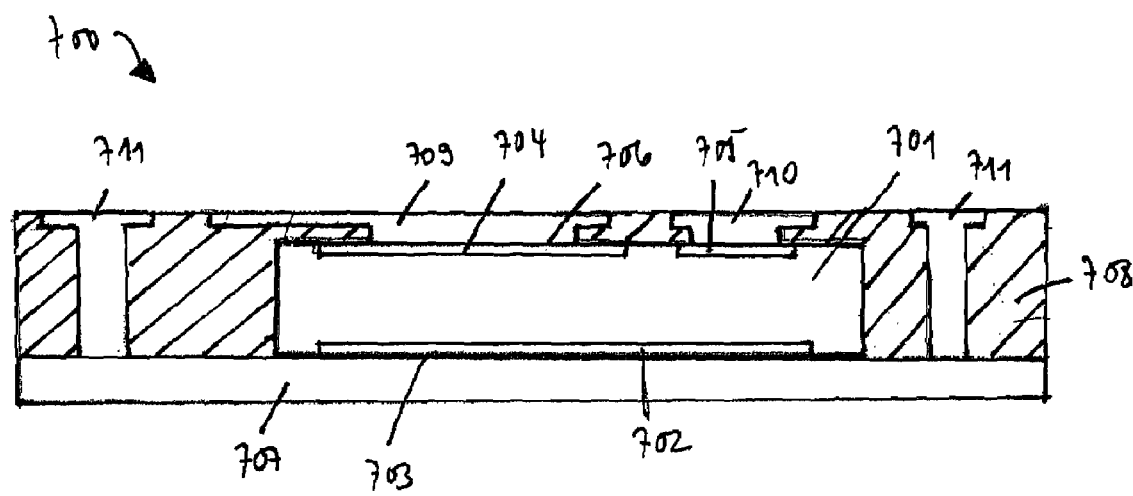
FIG. 7 illustrates a schematic illustration of a module 700 as a further exemplary embodiment.

FIG. 7 illustrates a module 700 representing a development of the module 100B illustrated in FIG. 1B. The module 700 contains a semiconductor chip 701 having a contact element 702 on a main surface 703 and contact elements 704 and 705 on a main surface 706. The semiconductor chip 701 is applied to a carrier 707, which includes copper, for example, and has a planar surface. The contact element 702 can be connected to the carrier 707 for example by diffusion soldering or by using a conductive adhesive. The semiconductor chip 701 and the carrier 707 are coated with a layer 708 made of photoresist.

The photoresist layer 708 may have been applied by using a stencil or by using spin-coating. The photoresist layer 708 has been photolithographically patterned and metallized. External contact elements 709, 710 and 711 connected to the contact elements 704 and 705 and the carrier 707, respectively, were produced in this case.

The external contact elements 709 may extend beyond the edge of the semiconductor chip 701 over the carrier 707. The semiconductor chip 701 may be, in particular, a vertical power MOSFET, the contact element 702 being the drain terminal, the contact element 704 being the source terminal and the contact element 705 being the gate terminal.

The module 700 may be fabricated in a manner corresponding to the module 600 illustrated in FIG. 6, that is to say that a plurality of semiconductor chips 701 are applied to a carrier 707, the semiconductor chips 701 are coated with a photoresist layer 708, the external contact elements 709 to 711 are produced and only then are the modules 700 singulated.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A module comprising:
    a semiconductor chip having a first contact element on a first main surface and a second contact element on a second main surface;
    an electrically conductive carrier having a depression, wherein the semiconductor chip is arranged within the depression in such a way that the first main surface of the semiconductor chip faces the carrier, and wherein the first contact element is electrically conductively connected to the carrier; and
    a first insulating layer and a wiring layer, which cover the second main surface of the semiconductor chip and the carrier.

2. The module of claim 1, comprising wherein the semiconductor chip is fixed to the carrier via an adhesion promoter and the adhesion promoter effects the electrically conductive connection.

3. The module of claim 1, comprising wherein an insulating material is arranged between a lateral face of the semiconductor chip and the carrier.

4. The module of claim 1, wherein the first insulating layer comprises a film.

5. The module of claim 4, comprising wherein the film is photopatternable.

6. The module of claim 1, comprising wherein the wiring layer connects the second contact element, to an external contact element and the external contact element has a larger contact area than the second contact element.

7. The module of claim 1, comprising wherein the semiconductor chip is a power semiconductor chip.

* * * * *

UNITED STATES PATENT AND TRADEMARK OFFICE
CERTIFICATE OF CORRECTION

| | | |
|---|---|---|
| PATENT NO. | : 7,759,777 B2 | Page 1 of 1 |
| APPLICATION NO. | : 11/735762 | |
| DATED | : July 20, 2010 | |
| INVENTOR(S) | : Ralf Otremba et al. | |

It is certified that error appears in the above-identified patent and that said Letters Patent is hereby corrected as shown below:

Title Page, Item (75) Inventors, "Charlie Tan Tien Lai" should correctly read -Tein Lai Tan--.

Signed and Sealed this
Thirty-first Day of July, 2012

David J. Kappos
*Director of the United States Patent and Trademark Office*